(12) United States Patent
Kim et al.

(10) Patent No.: US 10,770,631 B2
(45) Date of Patent: Sep. 8, 2020

(54) DISPLAY APPARATUS USING SEMI-CONDUCTOR LIGHT-EMITTING DEVICE

(71) Applicant: LG ELECTRONICS INC., Seoul (KR)

(72) Inventors: Seonock Kim, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 135 days.

(21) Appl. No.: 15/998,662

(22) PCT Filed: Feb. 16, 2017

(86) PCT No.: PCT/KR2017/001684
§ 371 (c)(1),
(2) Date: Aug. 16, 2018

(87) PCT Pub. No.: WO2017/142315
PCT Pub. Date: Aug. 24, 2017

(65) Prior Publication Data
US 2020/0083415 A1 Mar. 12, 2020

(30) Foreign Application Priority Data
Feb. 16, 2016 (KR) .......................... 10-2016-0017891

(51) Int. Cl.
| | | |
|---|---|---|
| H01L 33/08 | (2010.01) |
| H01L 33/56 | (2010.01) |
| G06F 1/16 | (2006.01) |
| H01L 33/62 | (2010.01) |

(52) U.S. Cl.
CPC ............ *H01L 33/56* (2013.01); *G06F 1/1652* (2013.01); *H01L 33/62* (2013.01)

(58) Field of Classification Search
CPC ........................................................ H01L 33/08
See application file for complete search history.

(56) References Cited

U.S. PATENT DOCUMENTS

2012/0313241 A1* 12/2012 Bower .................. H01L 21/563
257/737
2014/0367705 A1* 12/2014 Bibl ........................ H01L 33/44
257/88

FOREIGN PATENT DOCUMENTS

| KR | 10-2007-0015327 A | 2/2007 |
| KR | 10-2011-0017247 A | 2/2011 |
| KR | 10-2013-0104182 A | 9/2013 |

(Continued)

*Primary Examiner* — Peniel M Gumedzoe
*Assistant Examiner* — Christopher A Johnson
(74) *Attorney, Agent, or Firm* — Birch, Stewart, Kolasch & Birch, LLP

(57) ABSTRACT

A display apparatus including a display unit; a plurality of semiconductor light emitting elements having at least a first conductive electrode to form individual pixels of the display unit; an adhesive layer disposed between adjacent semiconductor light emitting elements; a thin-film transistor having a gate region disposed closer to an upper surface of the display unit than a source region and a drain region; a via hole formed in the adhesive layer; and a via hole electrode extending in the via hole and electrically connecting the at least one conductive electrode of a corresponding semiconductor light emitting element and the source-drain electrode of the thin-film transistor.

16 Claims, 21 Drawing Sheets

(56) References Cited

FOREIGN PATENT DOCUMENTS

| | | |
|---|---|---|
| KR | 10-2014-0086494 A | 7/2014 |
| KR | 10-2014-0097940 A | 8/2014 |

* cited by examiner

DISPLAY APPARATUS USING SEMI-CONDUCTOR LIGHT-EMITTING DEVICE

CROSS-REFERENCE TO RELATED APPLICATIONS

This application is the National Phase of PCT International Application No. PCT/KR2017/001684, filed on Feb. 16, 2017, which claims priority under 35 U.S.C. § 119(a) to Patent Application No. 10-2016-0017891, filed in Republic of Korea on Feb. 16, 2016, all of which are hereby expressly incorporated by reference into the present application.

BACKGROUND OF THE INVENTION

1. Field of the Invention

The present disclosure relates to a display apparatus, and more particularly, to a flexible display apparatus using a semi-conductor light-emitting device.

2. Description of the Conventional Art

In recent years, display apparatuses having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs. On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semi-conductor light-emitting devices may be used to implement a flexible display, thereby presenting a scheme for solving the problems.

The flexible display using the semi-conductor light-emitting device may be fabricated by a process of adhering a semi-conductor light-emitting device to a wiring substrate using a conductive adhesive layer. In particular, when an anisotropic conductive film (ACF) is used to electrically connect a wiring electrode and a conductive electrode of the semi-conductor light-emitting device, the thin-film transistor may be damaged or broken in the bonding process. Although the problem can be solved through a method of metal-bonding the semi-conductor light-emitting device to the wiring without using the anisotropic conductive film, this method is difficult to ensure reliability in a fine pitch display apparatus.

Accordingly, the present disclosure proposes a new type of wiring mechanism that is highly reliable in wiring without using a conductive adhesive layer in a display apparatus using a semi-conductor light-emitting device.

SUMMARY OF THE INVENTION

An object of the present disclosure is to implement a wiring structure of semi-conductor light-emitting devices without using a conductive adhesive layer.

Another object of the present disclosure is to implement a wiring structure capable of forming a thin-film transistor subsequent to transferring a semi-conductor light-emitting device.

The display apparatus according to the present disclosure may allow a fabrication process of forming a thin-film transistor on an array of semi-conductor light-emitting devices through a thin-film transistor with a top-bottom reversed structure. More specifically, in the present disclosure, the vertical direction of a gate and a source-drain may be changed as compared with the case of transferring a semi-conductor light-emitting device, particularly a micro LED, onto a thin-film transistor.

More specifically, a display apparatus according to the present disclosure may include a display unit disposed on an upper surface thereof, a semiconductor light emitting element provided with at least one conductive electrode to form individual pixels of the display unit, a thin-film transistor in which a gate region is disposed closer to the upper surface than a source region and a drain region, and an adhesive layer having one side disposed with the semi-conductor light-emitting device and the other side disposed with the thin-film transistor, wherein a via hole is formed in the adhesive layer to electrically connect the at least one conductive electrode and the source-drain electrode of the thin-film transistor.

According to an embodiment, the via hole may be formed to overlap with the at least one conductive electrode in the adhesive layer, and electrically connected to the at least one conductive electrode. The display apparatus may further include a connection electrode extended from the via hole to the thin-film transistor to electrically connect the via hole to the thin-film transistor.

According to an embodiment, the thin-film transistor may include an insulating layer covering the other surface of the adhesive layer, and a gate region may be formed on one side of the insulating layer, and a source region and a drain region may be formed on the other side thereof. The gate region may include a gate electrode disposed on the other surface of the adhesive layer. The source region and the drain region may be located below the insulating layer, which is farther from the upper surface than the gate region.

According to an embodiment, a passivation layer for protecting the thin-film transistor may be formed on the other surface of the adhesive layer. A pixel electrode of the thin-film transistor may be formed to pass through the passivation layer from the thin-film transistor. A flexible substrate may cover a lower side of the passivation layer.

According to an embodiment, a first conductive electrode of the semi-conductor light-emitting device may be electrically connected to the thin-film transistor, and a second conductive electrode of the semi-conductor light-emitting device may be electrically connected to a common electrode. At least part of the first conductive electrode may be inserted into the adhesive layer.

In a display apparatus according to the present disclosure, a thin-film transistor and a semi-conductor light-emitting device may be electrically connected through a via hole of an adhesive layer, thereby implementing a wiring structure in which the semi-conductor light-emitting device is transferred to the adhesive layer and then the thin-film transistor is formed thereon.

Furthermore, the process of transferring the semi-conductor light-emitting device and then forming the thin-film transistor may be allowed through a structure in which a gate region is closer to an upper surface of the display than a source region and a drain region.

In addition, in the present disclosure, a via hole of an adhesive layer may be used, thereby implementing a wiring structure that does not require a conductive material such as an anisotropic conductive film. Through this, it may be possible to prevent the thin-film transistor from being damaged or broken by an impact applied to the display apparatus in the process of bonding the wiring electrode and the semi-conductor light-emitting device.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
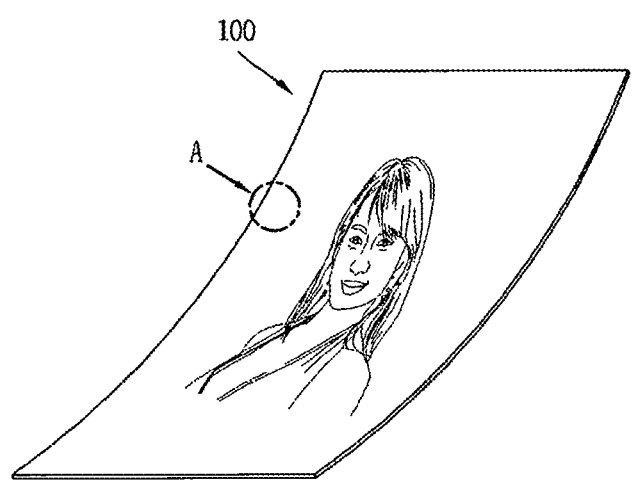
FIG. 1 is a conceptual view illustrating a display apparatus using a semi-conductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween. A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display apparatus using a semi-conductor light-emitting device according to an embodiment of the present disclosure. According to the drawing, information processed in the controller of the display apparatus 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semi-conductor light-emitting device. According to the present disclosure, a light emitting diode (LED) is illustrated as a type of semi-conductor light-emitting device. The light emitting diode may be formed with a small size to perform the role of a sub-pixel even in the second configuration through this.

Figure 2:
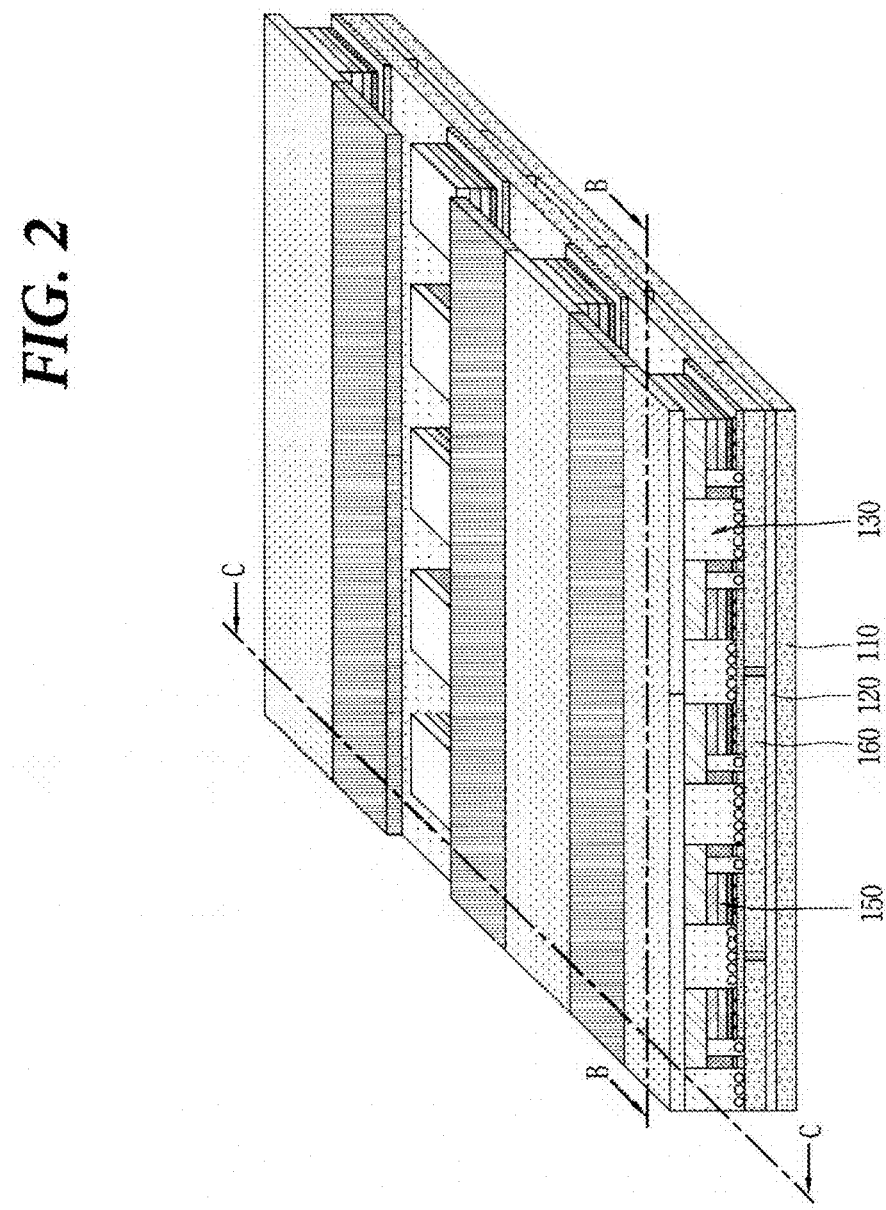
FIG. 2 is a partial enlarged view of portion "A" in FIG. 1, and FIGS. 3A and 3B are cross-sectional views taken along lines B-B and C-C in FIG. 2.

Hereinafter, a flexible display implemented using the light emitting diode will be described in more detail with reference to the accompanying drawings. FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip chip type semi-conductor light-emitting device in FIG. 3A, and FIGS. 5A through 5C are conceptual views illustrating various forms for implementing colors in connection with a flip chip type semi-conductor light-emitting device.

Figure 3A:
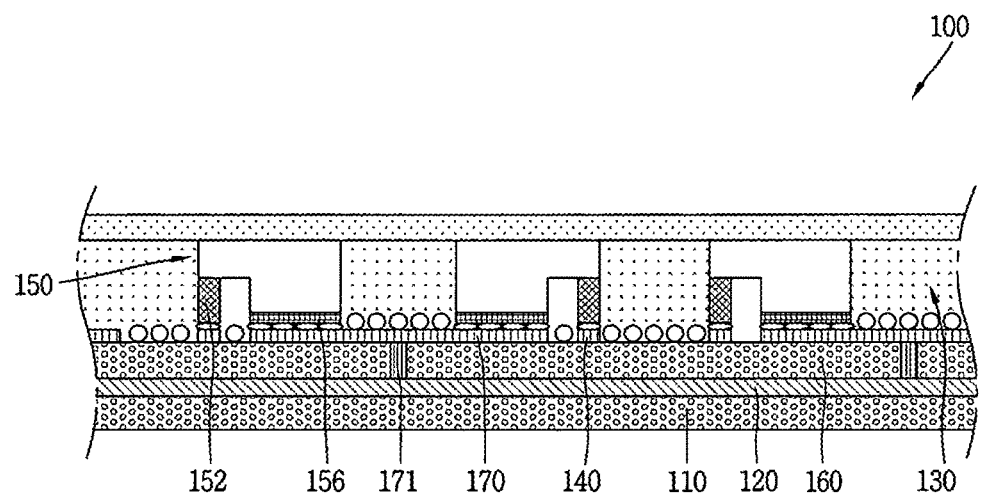
Figure 3B:
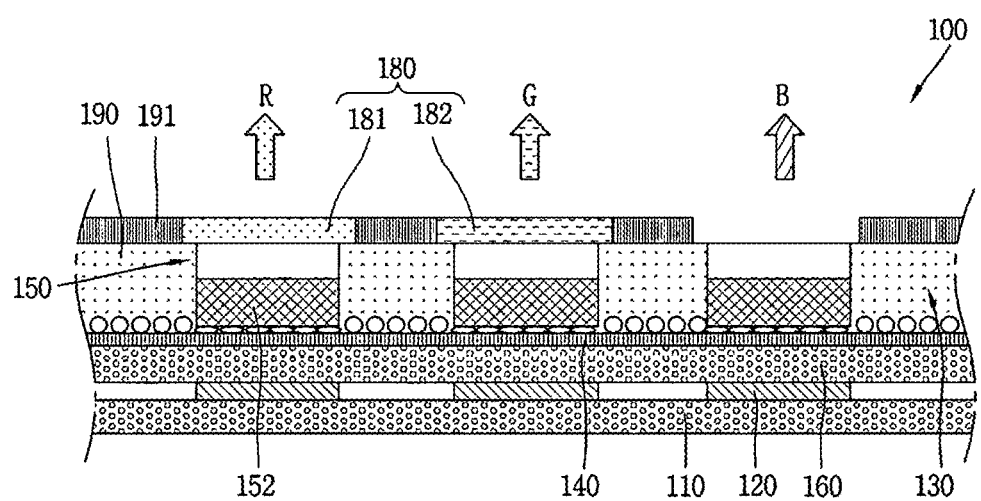
Figure 4:
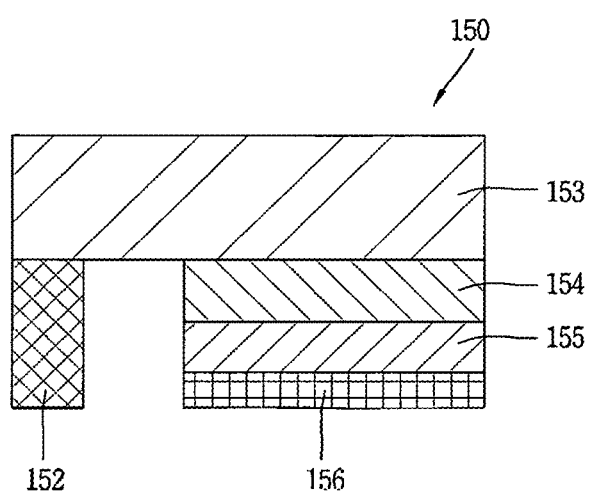
FIG. 4 is a conceptual view illustrating a flip chip type semi-conductor light-emitting device in FIG. 3.

According to the drawings in FIGS. 2, 3A and 3B, there is illustrated a display apparatus 100 using a passive matrix (PM) type semi-conductor light-emitting device as a display apparatus 100 using a semi-conductor light-emitting device. However, an example described below may also be applicable to an active matrix (AM) type semi-conductor light-emitting device.

The display apparatus 100 may include a substrate 110, a first electrode 120, a conductive adhesive layer 130, a second electrode 140, and a plurality of semi-conductor light-emitting devices 150. The substrate 110 may be a flexible substrate. The substrate 110 may contain glass or polyimide (PI) to implement the flexible display apparatus. In addition, if it is a flexible material, any one such as polyethylene naphthalate (PEN), polyethylene terephthalate (PET) or the like may be used. Furthermore, the substrate 110 may be either one of transparent and non-transparent materials. The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semi-conductor light-emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semi-conductor light-emitting device 150 is connect thereto in a flip chip form with the application of heat and pressure, the semi-conductor light-emitting device 150 is electrically connected to the first electrode 120 and second electrode 140.

Referring to FIG. 4, the semi-conductor light-emitting device may be a flip chip type semi-conductor light-emitting device. For example, the semi-conductor light-emitting device may include a p-type electrode 156, a p-type semi-conductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semi-conductor light-emitting devices 150. For example, the left and right p-type electrodes of the semi-conductor light-emitting devices around the auxiliary electrode may be electrically connected to one auxiliary electrode.

More specifically, the semi-conductor light-emitting device 150 is pressed into the conductive adhesive layer 130, and through this, only a portion between the p-type electrode 156 and auxiliary electrode 170 of the semi-conductor light-emitting device 150 and a portion between the n-type electrode 152 and second electrode 140 of the semi-conductor light-emitting device 150 have conductivity, and the remaining portion does not have conductivity since there is no push-down of the semi-conductor light-emitting device. As described above, the conductive adhesive layer 130 may form an electrical connection as well as allow a mutual coupling between the semi-conductor light-emitting device 150 and the auxiliary electrode 170 and between the semi-conductor light-emitting device 150 and the second electrode 140.

Furthermore, a plurality of semi-conductor light-emitting devices 150 constitute a light-emitting array, and a phosphor layer 180 is formed on the light-emitting array. The light emitting device array may include a plurality of semi-conductor light-emitting devices with different self-luminance values. Each of the semi-conductor light-emitting devices 150 constitutes a sub-pixel, and is electrically connected to the first electrode 120. For example, there may exist a plurality of first electrodes 120, and the semi-conductor light-emitting devices are arranged in several rows, for instance, and each row of the semi-conductor light-emitting devices may be electrically connected to any one of the plurality of first electrodes.

Furthermore, the semi-conductor light-emitting devices may be connected in a flip chip form, and thus semi-conductor light-emitting devices grown on a transparent dielectric substrate. Furthermore, the semi-conductor light-emitting devices may be nitride semi-conductor light-emitting devices, for instance. The semi-conductor light-emitting device 150 has an excellent luminance characteristic, and thus it may be possible to configure individual sub-pixels even with a small size thereof.

According to the drawing, a partition wall 190 may be formed between the semi-conductor light-emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semi-conductor light-emitting device 150 is inserted into the anisotropic conductive film.

Furthermore, when the base member of the anisotropic conductive film is black, the partition wall 190 may have reflective characteristics while at the same time increasing contrast with no additional black insulator. For another example, a reflective partition wall may be separately provided with the partition wall 190. In this case, the partition wall 190 may include a black or white insulator according to the purpose of the display apparatus. It may have an effect of enhancing reflectivity when the partition wall of the while insulator is used, and increase contrast while at the same time having reflective characteristics.

The phosphor layer 180 may be located at an outer surface of the semi-conductor light-emitting device 150. For example, the semi-conductor light-emitting device 150 is a blue semi-conductor light-emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semi-conductor light-emitting device 151 at a location implementing a red sub-pixel, and a green phosphor 182 capable of converting blue light into green (G) light may be deposited on the blue semi-conductor light-emitting device 151 at a location implementing a green sub-pixel. Furthermore, only the blue semi-conductor light-emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semi-conductor light-emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure may not be necessarily limited to this, and another structure for implementing blue, red and green may be also applicable thereto.

Figure 5A:
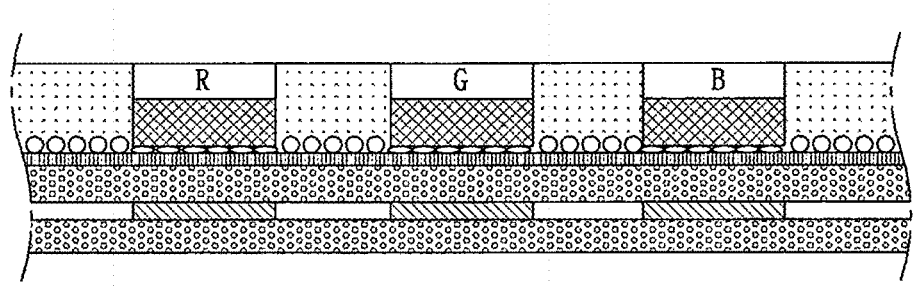
FIGS. 5A through 5C are conceptual views illustrating various forms for implementing colors in connection with a flip chip type semi-conductor light-emitting device.

Referring to FIG. 5A, each of the semi-conductor light-emitting devices 150 may be implemented with a high-power light emitting device that emits various lights including blue in which gallium nitride (GaN) is mostly used, and indium (In) and or aluminum (Al) are added thereto. In this case, the semi-conductor light-emitting device 150 may be red, green and blue semi-conductor light-emitting devices, respectively, to implement each sub-pixel. For instance, red, green and blue semi-conductor light-emitting devices (R, G, B) are alternately disposed, and red, green and blue subpixels implement one pixel by means of the red, green and blue semi-conductor light-emitting devices, thereby implementing a full color display.

Figure 5B:
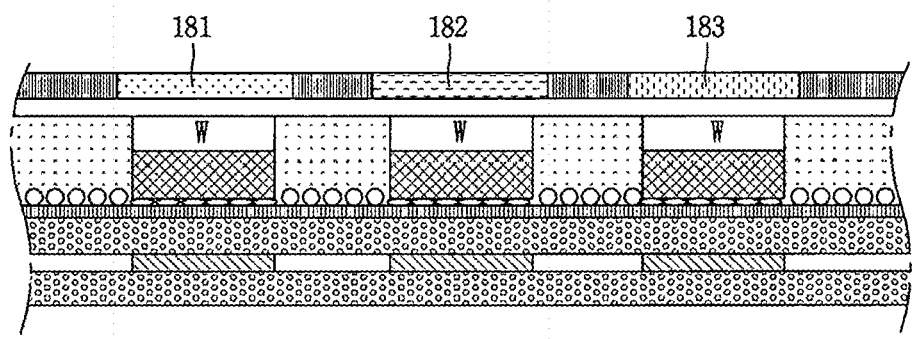

Referring to FIG. 5B, the semi-conductor light-emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
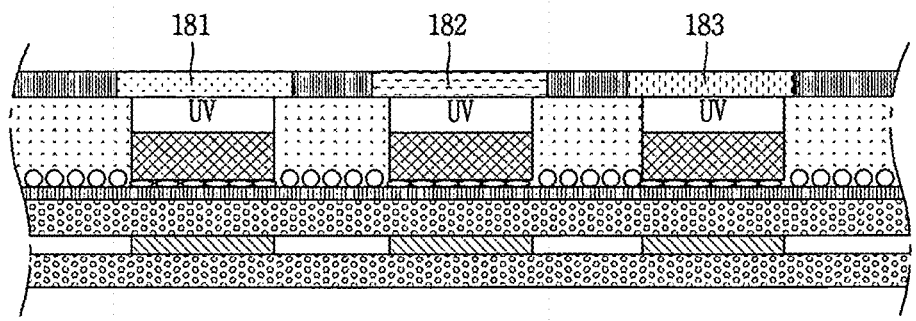

Referring to FIG. 5C, it may be possible to also have a structure in which a red phosphor layer 181, a green phosphor layer 182 and blue phosphor layer 183 may be provided on a ultra violet light emitting device (UV). In this manner, the semi-conductor light-emitting device can be used over the entire region up to ultra violet (UV) as well as visible light, and may be extended to a form of semi-conductor light-emitting device in which ultra violet (UV) can be used as an excitation source.

Taking the present example into consideration again, the semi-conductor light-emitting device 150 is placed on the conductive adhesive layer 130 to configure a sub-pixel in the display apparatus. The semi-conductor light-emitting device 150 may have excellent luminance characteristics, and thus it may be possible to configure individual sub-pixels even with a small size thereof. The size of the individual semi-conductor light-emitting device 150 may be less than 80 µm in the length of one side thereof, and formed with a rectangular or square shaped element. In case of a rectangular shaped element, the size thereof may be less than 20×80 µm.

Furthermore, even when a square shaped semi-conductor light-emitting device 150 with a length of side of 10 µm is used for a sub-pixel, it will exhibit a sufficient brightness for implementing a display apparatus. Accordingly, for example, in case of a rectangular pixel in which one side of a sub-pixel is 600 µm in size, and the remaining one side thereof is 300 µm, a relative distance between the semi-conductor light-emitting devices becomes sufficiently large. Accordingly, in this case, it may be possible to implement a flexible display apparatus having a HD image quality.

A display apparatus using the foregoing semi-conductor light-emitting device will be fabricated by a new type of fabrication method. Hereinafter, the fabrication method will be described with reference to FIG. 6.

Figure 6:
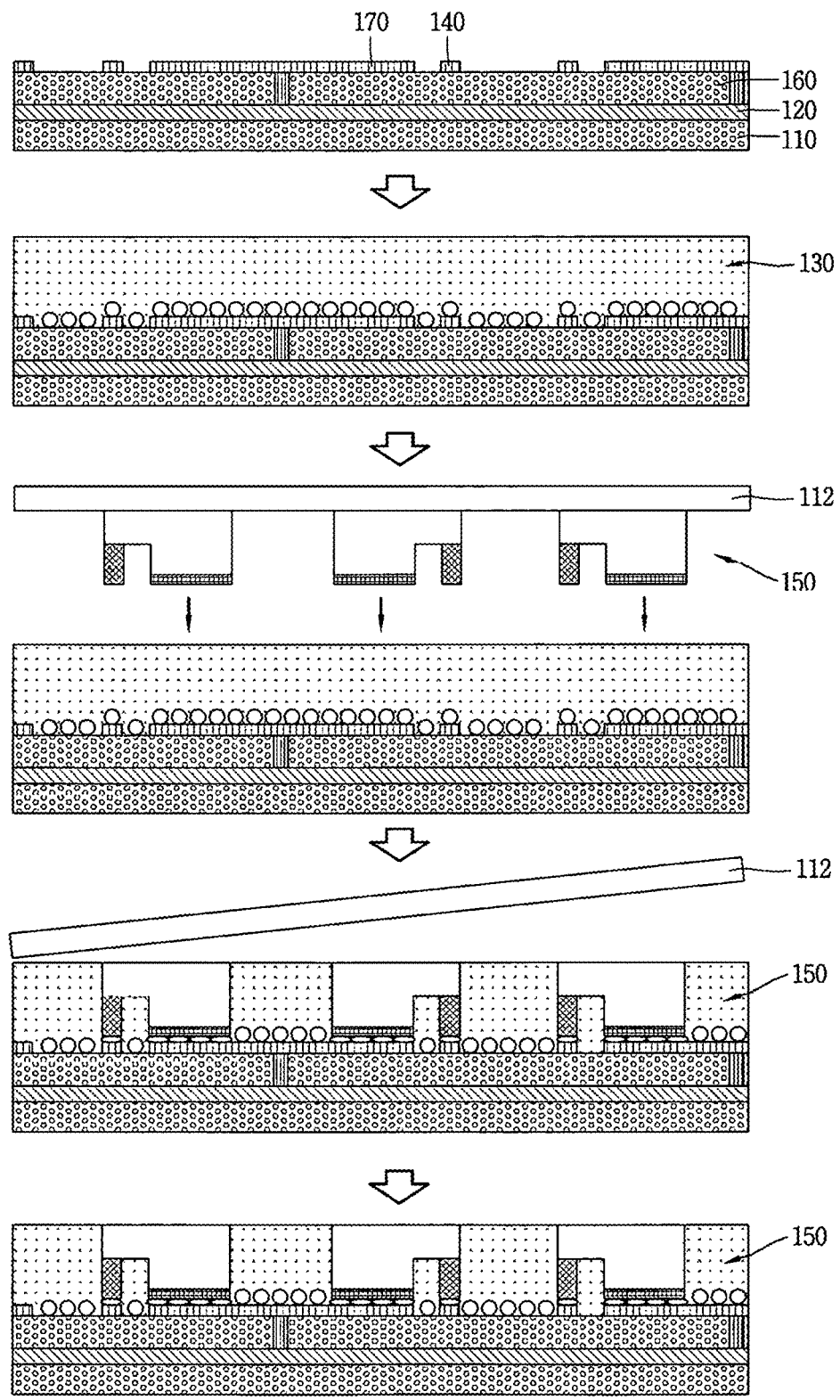
FIG. 6 is cross-sectional views illustrating a fabrication method of a display apparatus using a semi-conductor light-emitting device according to the present disclosure.

FIG. 6 is cross-sectional views illustrating a fabrication method of a display apparatus using a semi-conductor light-emitting device according to the present disclosure. Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160. Next, a second substrate 112 located with a plurality of semi-conductor light-emitting devices 150 corresponding to the location of the auxiliary electrodes 170 and second electrodes 140 and constituting individual pixels is disposed such that the semi-conductor light-emitting device 150 faces the auxiliary electrode 170 and second electrode 140.

In this case, the second substrate 112 as a growth substrate for growing the semi-conductor light-emitting device 150 may be a sapphire substrate or silicon substrate. The semi-conductor light-emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semi-conductor light-emitting device 150 and the auxiliary electrode 170 and second electrode 140 may have conductivity due to the characteristics of an anisotropic conductive film having conductivity by thermal compression, thereby allowing the electrodes and semi-conductor light-emitting device 150 to be electrically connected to each other. At this time, the semi-conductor light-emitting device 150 may be inserted into the anisotropic conductive film, thereby forming a partition wall between the semi-conductor light-emitting devices 150.

Next, the second substrate 112 is removed. For example, the second substrate 112 may be removed using a laser lift-off (LLO) or chemical lift-off (CLO) method. Finally, the second substrate 112 is removed to expose the semi-conductor light-emitting devices 150 to the outside. Silicon oxide (SiOx) or the like may be coated on the wiring substrate coupled to the semi-conductor light-emitting device 150 to form a transparent insulating layer (not shown).

Furthermore, it may further include the process of forming a phosphor layer on one surface of the semi-conductor light-emitting device 150. For example, the semi-conductor light-emitting device 150 may be a blue semi-conductor light-emitting device for emitting blue (B) light, and red or green phosphor for converting the blue (B) light into the color of the sub-pixel may form a layer on one surface of the blue semi-conductor light-emitting device.

The fabrication method or structure of a display apparatus using the foregoing semi-conductor light-emitting device may be modified in various forms. For such an example, the foregoing display apparatus may be applicable to a vertical semi-conductor light-emitting device. Hereinafter, the vertical structure will be described with reference to FIGS. 5 and 6. Furthermore, according to the following modified example or embodiment, the same or similar reference numerals are designated to the same or similar configurations to the foregoing example, and the description thereof will be substituted by the earlier description.

Figure 7:
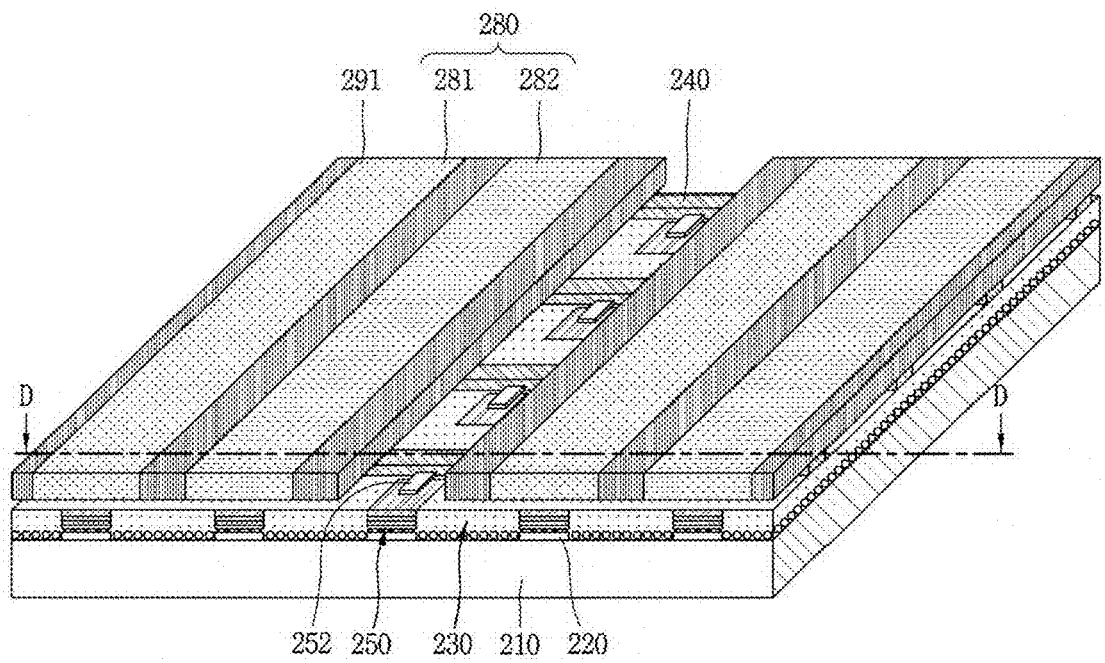
FIG. 7 is a perspective view illustrating a display apparatus using a semi-conductor light-emitting device according to another embodiment of the present disclosure.
Figure 8:
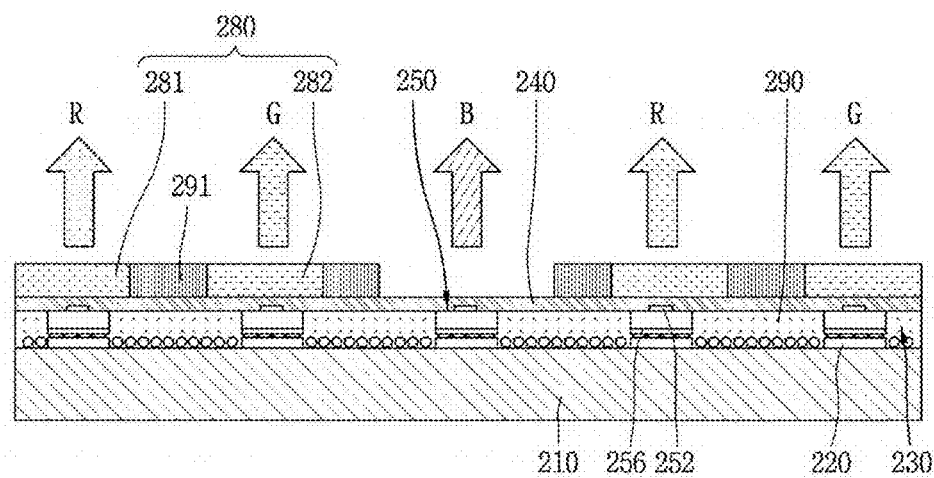
FIG. 8 is a cross-sectional view taken along line D-D in FIG. 7.
Figure 9:
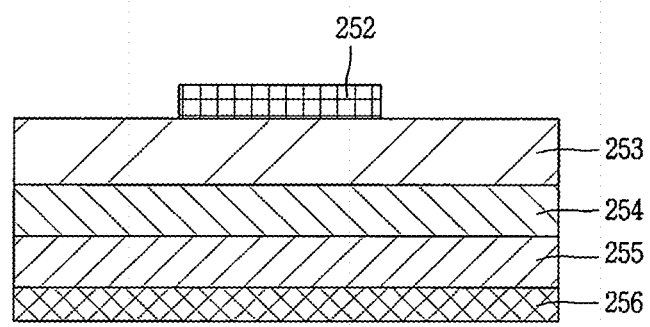
FIG. 9 is a conceptual view illustrating a vertical type semi-conductor light-emitting device in FIG. 8.

FIG. 7 is a perspective view illustrating a display apparatus using a semi-conductor light-emitting device according to another embodiment of the present disclosure. FIG. 8 is a cross-sectional view taken along line C-C in FIG. 7, and FIG. 9 is a conceptual view illustrating a vertical type semi-conductor light-emitting device in FIG. 8. According to the drawings, the display apparatus may be display apparatus using a passive matrix (PM) type of vertical semi-conductor light-emitting device.

The display apparatus may include a substrate 210, a first electrode 220, a conductive adhesive layer 230, a second electrode 240 and a plurality of semi-conductor light-emitting devices 250. The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode. The conductive adhesive layer 230 is formed on the substrate 210 located with the first electrode 220. Similarly to a display apparatus to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semi-conductor light-emitting device 250 thereto, the semi-conductor light-emitting device 250 is electrically connected to the first electrode 220. At this time, the semi-conductor light-emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semi-conductor light-emitting device 250 and the first electrode 220.

In this manner, the semi-conductor light-emitting device 250 is placed on the conductive adhesive layer 230, thereby configuring a separate sub-pixel in the display apparatus. The semi-conductor light-emitting device 250 may have excellent luminance characteristics, and thus it may be possible to configure individual sub-pixels even with a small size thereof. The size of the individual semi-conductor light-emitting device 250 may be less than 80 μm in the length of one side thereof, and formed with a rectangular or square shaped element. In case of a rectangular shaped element, the size thereof may be less than 20×80 μm. The semi-conductor light-emitting device 250 may be a vertical structure.

A plurality of second electrodes 240 disposed in a direction of crossing the length direction of the first electrode 220, and electrically connected to the vertical semi-conductor light-emitting device 250 may be located between vertical semi-conductor light-emitting devices.

Referring to FIG. 9, the vertical semi-conductor light-emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semi-conductor light-emitting device 250, thereby providing a great advantage capable of reducing the chip size.

Referring again to FIG. 8, a phosphor layer 280 may be formed on one surface of the semi-conductor light-emitting device 250. For example, the semi-conductor light-emitting device 250 is a blue semi-conductor light-emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semi-conductor light-emitting device 251 at a location implementing a red sub-pixel, and a green phosphor 282 capable of converting blue light into green (G) light may be deposited on the blue semi-conductor light-emitting device 251 at a location implementing a green sub-pixel. Furthermore, only the blue semi-conductor light-emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light emitting device is applied.

Taking the present embodiment into consideration again, the second electrode 240 is located between the semi-conductor light-emitting devices 250, and electrically connected to the semi-conductor light-emitting devices 250. For example, the semi-conductor light-emitting devices 250 may be disposed in a plurality of rows, and the second electrode 240 may be located between the rows of the semi-conductor light-emitting devices 250.

Since a distance between the semi-conductor light-emitting devices 250 constituting individual pixels is sufficiently large, the second electrode 240 may be located between the semi-conductor light-emitting devices 250. The second electrode 240 may be formed with a bar-shaped electrode elongated in one direction, and disposed in a perpendicular direction to the first electrode.

Furthermore, the second electrode 240 may be electrically connected to the semi-conductor light-emitting device 250 by a connecting electrode protruded from the second electrode 240. More specifically, the connecting electrode may be an n-type electrode of the semi-conductor light-emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semi-conductor light-emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semi-conductor light-emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semi-conductor light-emitting device 250, the ITO material has a problem of bad adhesiveness with an n-type semiconductor. Accordingly, the second electrode 240 may be placed between the semi-conductor light-emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semi-conductor light-emitting devices 250. In other words, the partition wall 290 may be disposed between the vertical semi-conductor light-emitting devices 250 to isolate the semi-conductor light-emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semi-conductor light-emitting device 250 is inserted into the anisotropic conductive film.

Furthermore, when the base member of the anisotropic conductive film is black, the partition wall 290 may have reflective characteristics while at the same time increasing contrast with no additional black insulator. For another example, a reflective partition wall may be separately provided with the partition wall 290. In this case, the partition wall 290 may include a black or white insulator according to the purpose of the display apparatus.

If the second electrode 240 is precisely located on the conductive adhesive layer 230 between the semi-conductor light-emitting devices 250, the partition wall 290 may be located between the semi-conductor light-emitting device 250 and second electrode 240. Accordingly, individual sub-pixels may be configured even with a small size using the semi-conductor light-emitting device 250, and a distance between the semi-conductor light-emitting devices 250 may be relatively sufficiently large to place the second electrode 240 between the semi-conductor light-emitting devices 250, thereby having the effect of implementing a flexible display apparatus having a HD image quality. Furthermore, according to the drawing, a black matrix 291 may be disposed between each phosphor layer to enhance contrast. In other words, the black matrix 291 can enhance the contrast of luminance.

As described above, the semi-conductor light-emitting device 250 is located on the conductive adhesive layer 230, thereby constituting individual pixels on the display apparatus. The semi-conductor light-emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semi-conductor light-emitting device.

The examples of the present disclosure described above have a passive matrix (PM) type structure. Although the foregoing examples are applicable to an active matrix (AM) type semi-conductor light-emitting device, in this case, the thin-film transistor may be damaged or broken in the bonding process for electrically connecting the wiring electrode and the semi-conductor light-emitting device. In order to solve this problem, the semi-conductor light-emitting device and the wiring electrode may be metal-bonded, but it is difficult to secure reliability in a fine pitch display apparatus.

Figure 10:
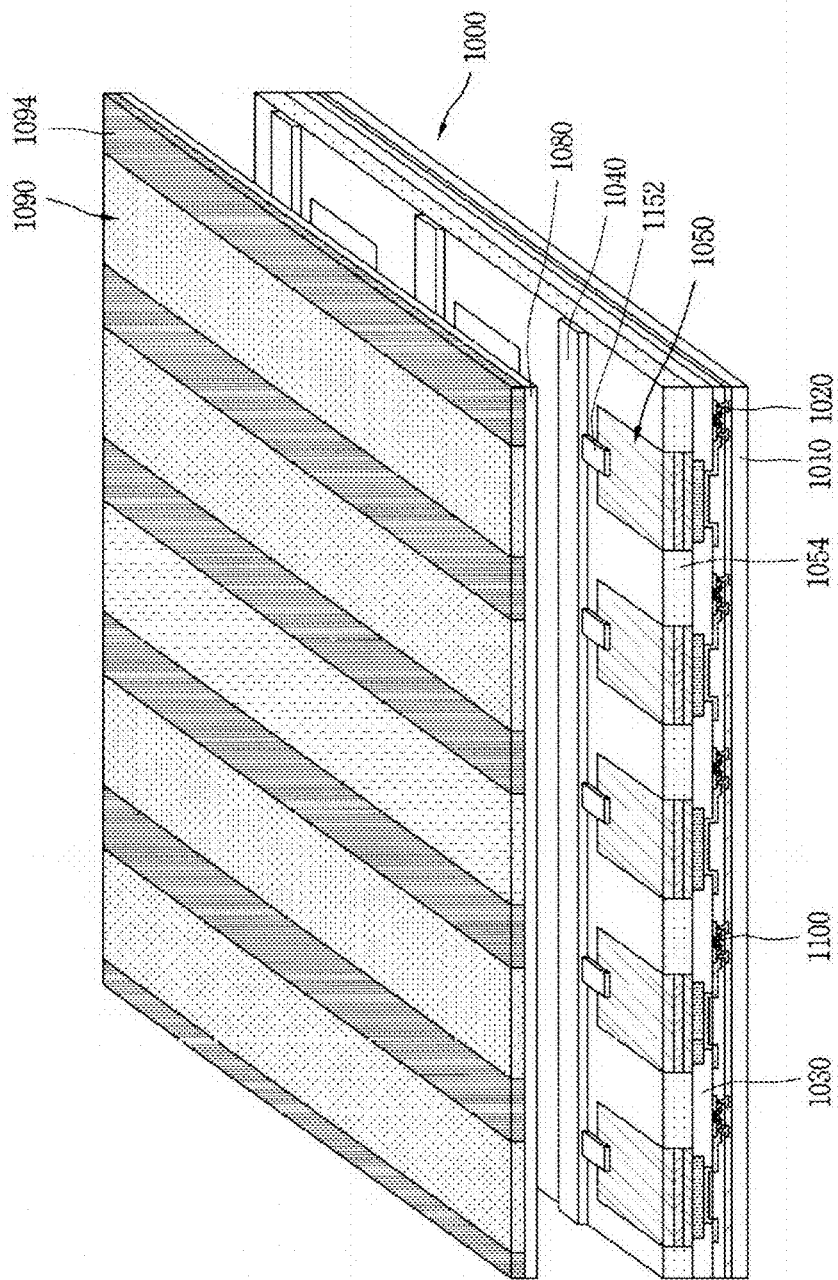
FIG. 10 is an enlarged view of portion "A" in FIG. 1 for explaining another embodiment of the present disclosure to which a semi-conductor light-emitting device having a new structure is applied.

In the present disclosure, a mechanism for solving all of these problems is presented, and hereinafter, another embodiment of the present disclosure having such a mechanism will be described. FIG. 10 is an enlarged view of portion "A" in FIG. 1 for explaining another embodiment of the present disclosure to which a semi-conductor light-emitting device having a new structure is applied, and FIG. 11 is a cross-sectional view taken along line E-E in FIG. 10, and FIG. 12 is a conceptual view in which a wiring structure in FIG. 10 is seen from above.

Figure 11:
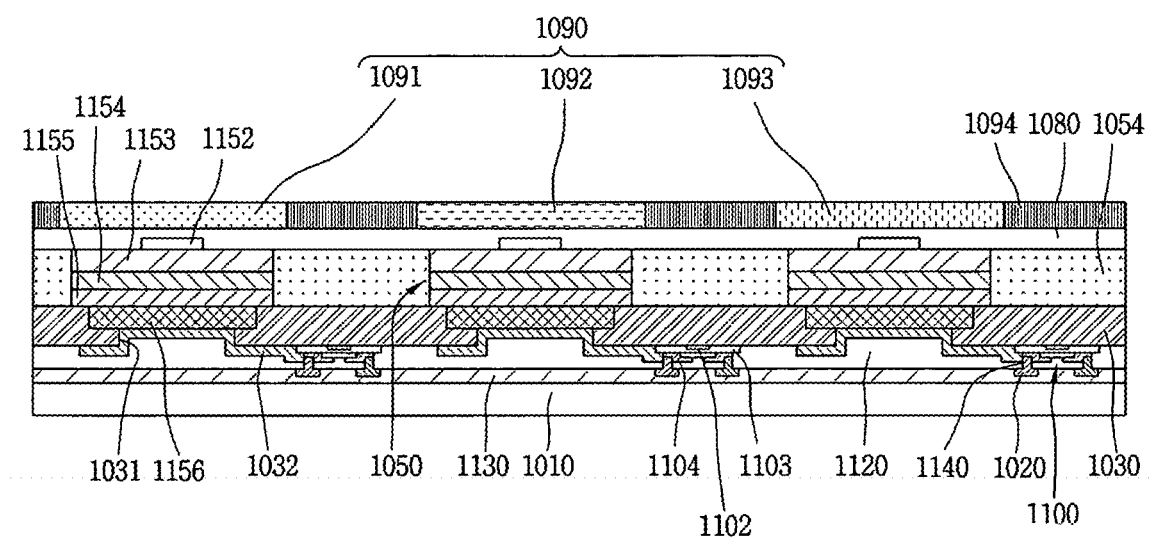
FIG. 11 is a cross-sectional view taken along line E-E in FIG. 10.
Figure 12:
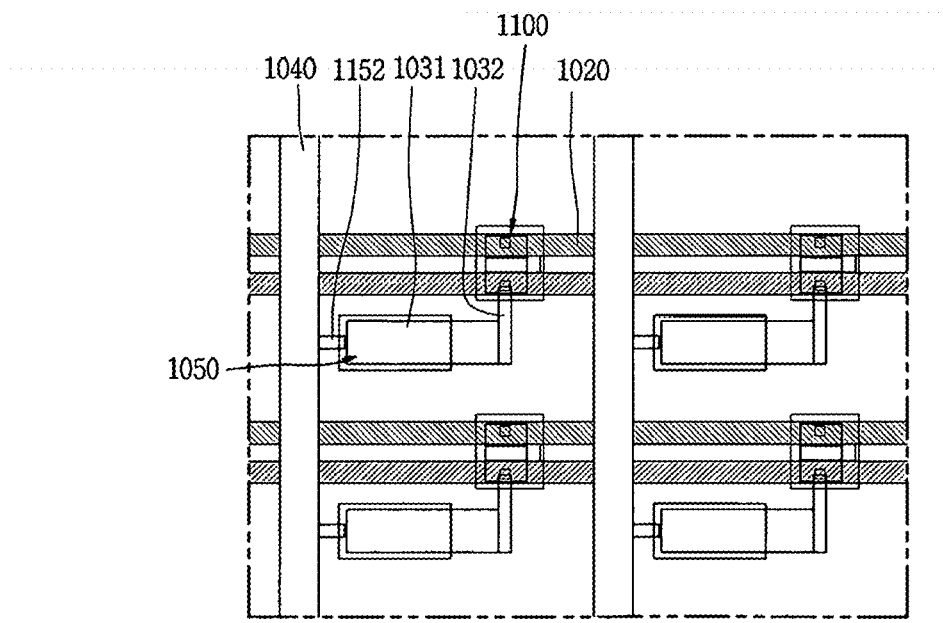
FIG. 12 is a conceptual view in which a wiring structure in FIG. 10 is seen from above.

According to the drawings in FIGS. 10, 11 and 12, there is illustrated a display apparatus 1000 using an active matrix type vertical semi-conductor light-emitting device as the display apparatus 1000 using a semi-conductor light-emitting device. The display apparatus 1000 forms a structure in which a plurality of semi-conductor light-emitting devices 1050 are electrically connected to a first electrode 1020 disposed on a lower side of the plurality of semi-conductor light-emitting devices 1050 and a second electrode 1040 disposed on an upper side thereof.

The first electrode 1020 may be formed on a substrate, and the substrate 1010 as a wiring substrate may include polyimide (PI) to implement a flexible display apparatus. Therefore, the substrate may be a flexible substrate. However, the present disclosure is not necessarily limited thereto, and the substrate may be any insulating and flexible material.

The semi-conductor light-emitting device 1050 may be a semi-conductor light-emitting device having a vertical structure. However, the present disclosure is not necessarily limited thereto, and a flip chip type semi-conductor light-emitting device may be used, which will be described later with reference to FIGS. 15 and 16.

The semi-conductor light-emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

According to the drawing, the first electrode 1020 may be connected to a thin-film transistor (TFT) 1100 as a pixel electrode provided per pixel, and the thin-film transistor 1100 may be connected to the first conductive electrode 1156. In this example, the pixel electrode is connected to the thin-film transistor 1100 to implement an active matrix (AM) type display.

Meanwhile, the second electrode 1040 may be a common electrode electrically connected to the second conductive electrode 1152. Furthermore, the second electrode 1040 may be an upper wiring disposed on an upper side of the semi-conductor light-emitting device. Here, the upper side denotes a portion near an upper surface of the display apparatus with respect to a lower side of the semi-conductor light-emitting device. On the other hand, an upper surface of the display apparatus may be a surface on which a display unit for displaying visual information is disposed on the display apparatus.

Moreover, in this case, the second electrode 1040 may include a plurality of electrode lines. As described above, in this example, the semi-conductor light-emitting device 1050 is electrically connected to the common electrode and the thin-film transistor 1100 to form an individual pixel.

Here, a blue light emitting diode that emits blue light may be used for the semi-conductor light-emitting device 1050, and a phosphor layer 1080 capable of converting a wavelength of light emitted from the light emitting device 1050 may be located on the semi-conductor light-emitting device 1050. For example, the phosphor layer 1080 may be a yellow phosphor layer that can be mixed with blue light to convert blue light into white light. For another example, the phosphor layer may include a polymer phosphor. A thickness of the phosphor layer may be decreased by a polymer phosphor.

A color filter portion 1090 may be disposed to cover the semi-conductor light-emitting device to implement three primary colors of red (R), green (G), and blue (B) using the white light converted by the phosphor layer 1080. In other words, a red (R) filter 1091, a green (G) filter 1092 and a blue (B) filter 1093 may be provided, a pixel formed by each light emitting device may form a sub-pixel, and these three color sub-pixels may form one pixel.

For another example, the blue (B) filter 1093 may be replaced with a diffusing agent or diffusing agent filter. For the diffusing agent, $TiO_2$ may be used, thereby allowing a response to a color viewing angle. In this case, the color filter portion 1090 is provided with the red (R) filter 1091, the green (G) filter 1092, and the diffusing agent filter.

Furthermore, in order to improve the contrast of the color filter portion 1090, the display apparatus may further include a black matrix 1094 disposed between each filter. The black matrix 1094 may be formed in such a manner that a gap is formed between the filters and a black material fills the gap. Through this, the black matrix 1094 may improve contrast between light and dark while absorbing external light reflection.

However, the present disclosure is not limited thereto, and the phosphor layer 1080 may include a red phosphor layer and a green phosphor layer to have a structure of converting light emitted from the blue light emitting device into red and green using the red phosphor layer and the green phosphor layer as shown in FIGS. 2, 3A and 3B.

On the other hand, the plurality of semi-conductor light-emitting devices may be adhered to the adhesive layer 1030. For the adhesive layer 1030, a conductive material such as the above-mentioned anisotropic conductive film or the like may not be used, and for example, a material having flexibility and adhesion may be used. For such an example, the adhesive layer 1030 may have a polymer-based material having adhesiveness. In this case, the adhesive layer 1030 may be mixed with a light reflecting material to reflect light generated from the semi-conductor light-emitting device in a downward direction may be reflected in an upward direction.

According to the drawing, an insulating material may be filled between the plurality of semi-conductor light-emitting devices 1050. Through this, a gap insulating layer 1054 may be formed between the light emitting devices 1050. Accordingly, the adhesive layer 1030 is disposed under the gap insulating layer 1054. Here, the insulating material is formed of a non-transparent material to prevent interference of color mixture between the semi-conductor light-emitting devices.

As described above, the gap insulating layer 1054 may be formed of a polymer-based material, and filled between the semi-conductor light-emitting devices to isolate the semi-conductor light-emitting devices. For another example, the adhesive layer 1030 may be replaced with a leveling layer for forming a thin-film transistor, and the gap insulating layer 1054 may be formed on the leveling layer. In the fabrication process, when the filling of the gap insulating layer 1054 is completed, a leveling layer is layered with a material such as polyimide or the like to provide a condition capable of forming a thin-film transistor. Hereinafter, in the present disclosure, only the adhesive layer will be described as an example, but in the following description, the adhesive layer may be replaced with the leveling layer.

On the other hand, the thin-film transistor 1100 is disposed under the adhesive layer 1030. For example, a passivation layer 1120 for protecting the thin-film transistor 1100 may be formed on the other surface of the adhesive layer 1030, which is a surface opposite to one surface of the adhesive layer 1030 covered by the insulating material, and the thin-film transistor 1100 may be disposed inside the passivation layer 1120. Here, the passivation layer 1120 may be a layer covering the thin-film transistor 1100 as an interlayer insulating layer made of an insulating material, and serves to fill a gap between the individual thin-film transistors 1100. For such an example, the passivation layer 1120 may be an inorganic layer ($SiO_2$, SiN), an organic layer (PI), or a dual structure of an inorganic layer/organic layer.

The flexible substrate 1010 covers a lower side of the passivation layer 1120, and the flexible substrate 1010 and the passivation layer 1120 may be coupled to each other by adhesion. Accordingly, an adhesive layer 1130 may also be disposed between the flexible substrate 1010 and the passivation layer 1120.

According to the drawing, a pixel electrode 1020 of the thin-film transistor 1100 is formed to pass through the passivation layer 1120 from the thin-film transistor 1100. For example, the thin-film transistor 1100 and the pixel electrode 1020 may be electrically connected to each other by a penetrating electrode 1140 passing through the passivation layer 1120.

In addition to the above-described layered structure of the present disclosure, a gate region of the thin-film transistor may be disposed closer to an upper surface of the display apparatus than a source region and a drain region thereof, And may be electrically connected to at least one conductive electrode of the device.

First, the thin-film transistor 1100 has a source region, a drain region, and a channel region, and a gate electrode 1102 is located in the channel region. Here, the source region is electrically connected to the semi-conductor light-emitting device, and thus a pixel to be emitted may be actively controlled by the driving of the thin-film transistor 1100.

In this case, the gate region is located closer to an upper surface of the display apparatus disposed with the display unit than the source region and the drain region, and thus the gate electrode 1102 of the gate region is disposed on the other surface of the adhesive layer 1030. Through this structure, the semi-conductor light-emitting device 1050 may be adhered to the adhesive layer 1030, and then the deposition process of the thin-film transistor 1100 may be carried out. In other words, the semi-conductor light-emitting device is adhered to one side of the adhesive layer 1030, and then the thin-film transistor 1100 is deposited on the other side of the adhesive layer 1030. In this case, at least part of the first conductive electrode 1156 of the semi-conductor light-emitting device may be inserted into the adhesive layer 1030.

More specifically, the thin-film transistor 1100 may include an insulating layer 1103 covering the other surface of the adhesive layer 1030, and a gate region may be formed on one side of the insulating layer 1103, and a source region and a drain region may be formed on the other side thereof. The source region and the drain region may be located below the insulating layer 1103, which is farther from the upper surface than the gate region. According to this structure, the thin-film transistor 1100 may be formed as an inverted structure in which a source region and a drain region are disposed on the upper side.

Furthermore, a via hole 1031 of the adhesive layer performs the role of electrically connecting the source and drain regions of the thin-film transistor 1100 with the first conductive electrode 1156 of the semi-conductor light-emitting device. The adhesive layer 2030 may include one side disposed with the semi-conductor light-emitting device and the other side disposed with the thin-film transistor. For example, the semi-conductor light-emitting device 1050 and the thin-film transistor 1100 are disposed on both sides of the adhesive layer 1030, and the first conductive electrode 1156 and the source-drain electrode 1104 of the thin-film transistor 1100 are electrically connected to each other through the via hole 1031. In this case, an pixel electrode of the thin-film transistor is electrically connected to the source-drain electrode 1104 and extended toward an adjacent semi-conductor light-emitting device. More specifically, the pixel electrode 1020 is configured to extend in a direction crossing the second electrode 1040 to connect the source-drain electrodes 1104 of neighboring thin-film transistors to each other. In addition, a gate wiring (not shown) extended in a direction parallel to the second electrode 1040 and connected to the gate electrode 1102 may be provided.

Moreover, the via hole 1031 is formed to overlap with the first conductive electrode 1156 in the adhesive layer, and a connection electrode 1032 extended from the via hole 1031 to electrically connect the via hole 1031 and the thin-film transistor and connected to the transistor is formed. The via hole 1031 is in direct contact with and electrically connected to the first conductive electrode 1156, and electrically connected to the source-drain electrode 1104 through the connection electrode 1032.

According to the present disclosure described above, a wiring structure capable of forming a thin-film transistor subsequent to transferring a semi-conductor light-emitting device may be implemented without using a conductive adhesive layer through a structure in which a via hole of an adhesive layer and a thin-film transistor are inverted.

Hereinafter, a fabrication method of forming a new wiring structure as described above will be described in detail with reference to the accompanying drawings. FIGS. 13A, 13B, 13C, 13D, 13E, 13F, 13G and 13H are cross-sectional views showing a method of fabricating the display apparatus in FIG. 10, and FIGS. 14A, 14B, 14C, 14D, 14E and 14F are cross-sectional views showing the process of FIG. 13F in more detail.

Figure 13A:
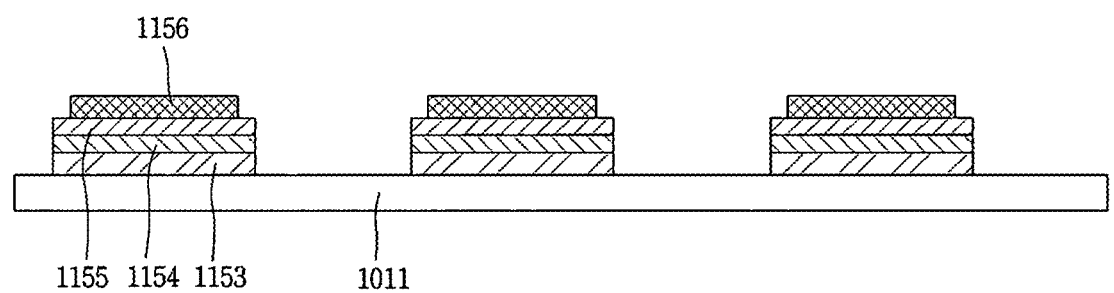
FIGS. 13A, 13B, 13C, 13D, 13E, 13F, 13G and 13H are cross-sectional views showing a method of fabricating the display apparatus in FIG. 10.

First, according to the fabrication method, the process of coupling a plurality of semi-conductor light-emitting devices to a substrate is carried out. For example, a first conductive semiconductor layer 1155, an active layer 1154, and a second conductive semiconductor layer 1153 are grown on a growth substrate, and each semi-conductor light-emitting devices is generated through etching, and then an electrode 1156 is formed (FIG. 13A).

The growth substrate 1011 (wafer) may be formed of any one of materials having light transmission properties, for example, sapphire ($Al_2O_3$), GaN, ZnO, and AlO, but is not limited thereto. Furthermore, the growth substrate 1101 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

The first conductive electrode 1156 and the first conductive semiconductor layer 1155 may be a p-type electrode and a p-type semiconductor layer, respectively. However, the present disclosure is not limited thereto, and the first conductive type may also be n-type.

Figure 13B:
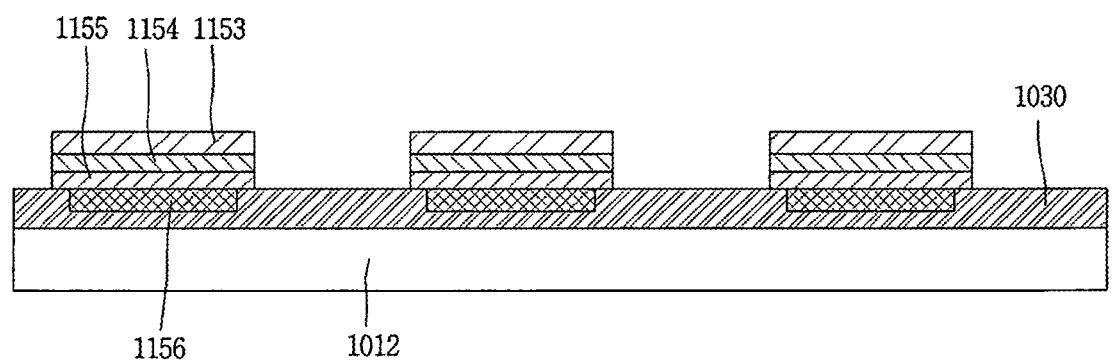

Next, the semi-conductor light-emitting device is coupled to a temporary substrate 1012 using the adhesive layer 1030, and the growth substrate 1011 is removed (FIG. 13B). The temporary substrate 1012 may be removed in a subsequent process and serves to support the adhesive layer 1030.

For the adhesive layer 1030, a conductive material such as the above-mentioned anisotropic conductive film or the like may not be used, and for example, a material having flexibility and adhesion may be used. For such an example, the adhesive layer 1030 may have a polymer-based material having adhesiveness. In this case, at least part of the first conductive electrode 1156 of the semi-conductor light-emitting device may be inserted into the adhesive layer 1030. Furthermore, the adhesive layer 1030 may be mixed with a light reflecting material to reflect light generated from the semi-conductor light-emitting device in a downward direction may be reflected in an upward direction.

Figure 13C:
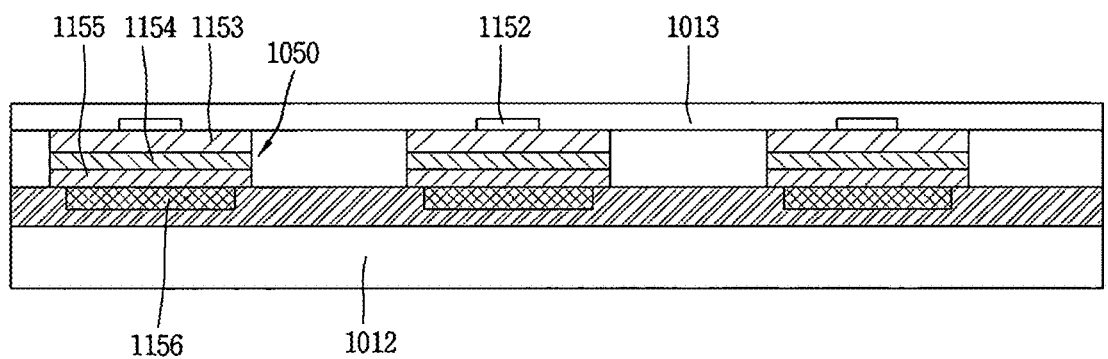

Next, the second conductive electrode 1152 is formed on the second conductive semiconductor layer of the semi-conductor light-emitting device, and the second electrodes 1040 (see FIG. 10) for connecting the second conductive electrodes 1152 of adjacent semi-conductor light-emitting devices to each other is formed (FIG. 13C). The second electrode 1040 as an upper wiring is directly connected to the second conductive electrode 1152, and in this case, the second conductive electrode 1152 and the second electrode 1040 are formed as transparent electrodes. For another example, the second conductive electrode 1152 and the second electrode 1040 are integrally formed to constitute an upper electrode, and the upper electrode may be formed to extend to an adjacent semi-conductor light-emitting device while covering the second conductive semiconductor layer.

According to the drawing, an insulating material may be filled between the plurality of semi-conductor light-emitting devices. Here, the insulating material is formed of a non-transparent material to prevent interference of color mixture between the semi-conductor light-emitting devices. In this case, a cover film 1013 may be mounted on the insulating material and the upper electrode. The cover film 1013 may be a film to be removed thereafter, and may perform the role of protecting the semi-conductor light-emitting device 1050 during the fabrication process.

Figure 13D:
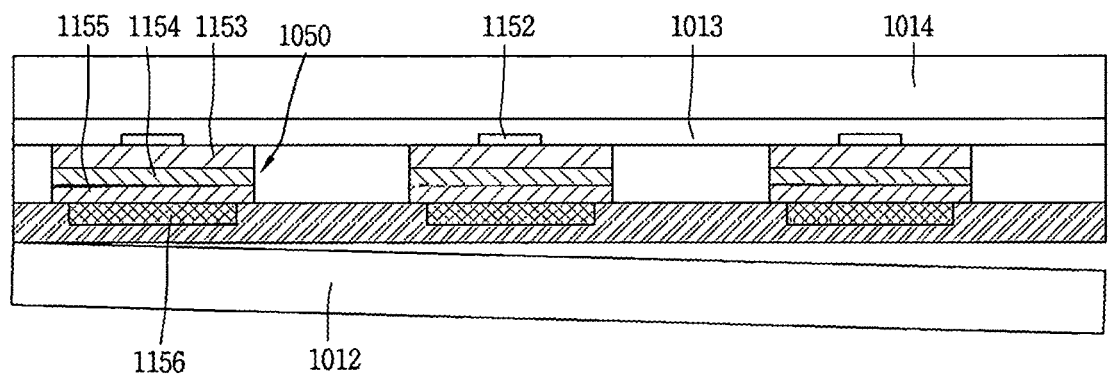

Next, the temporary substrate 1012 is removed, and the cover film 1013 is adhered to another temporary substrate 1014 (FIG. 13D). At this time, the temporary substrate 1012 may be removed by a laser lift-off (LLO) method. In addition, at least one of the cover film 1013 and the second temporary substrate may be formed of an adhesive material for adhesion between the second temporary substrate 1014 and the cover film 1013.

Figure 13E:
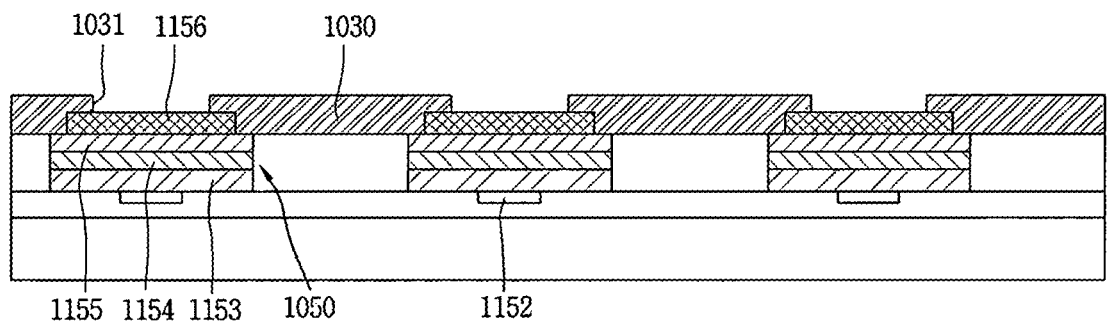

Next, the process of forming a via hole in the adhesive layer 1030 is carried out (FIG. 13E). The via hole may be formed to overlap with the first conductive electrode 1156 in the adhesive layer. The first conductive electrode 1156 is exposed to the outside through the via hole 1031 without being covered by the adhesive layer.

Figure 13F:
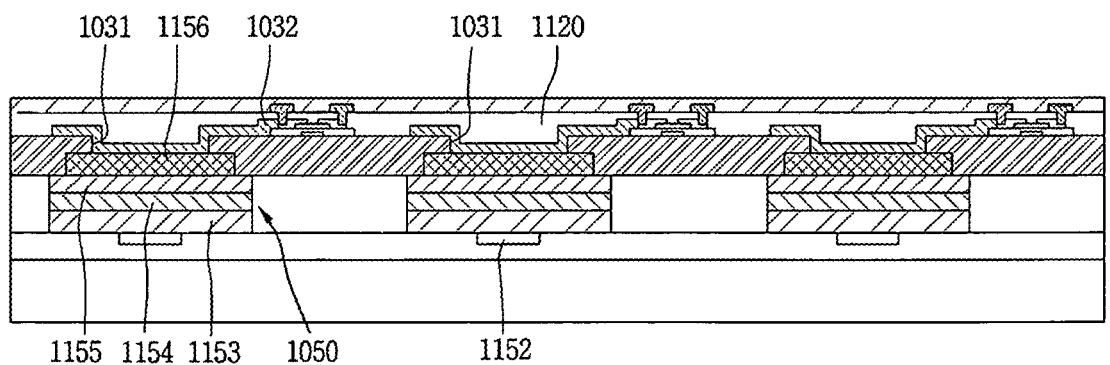
Figure 13G:
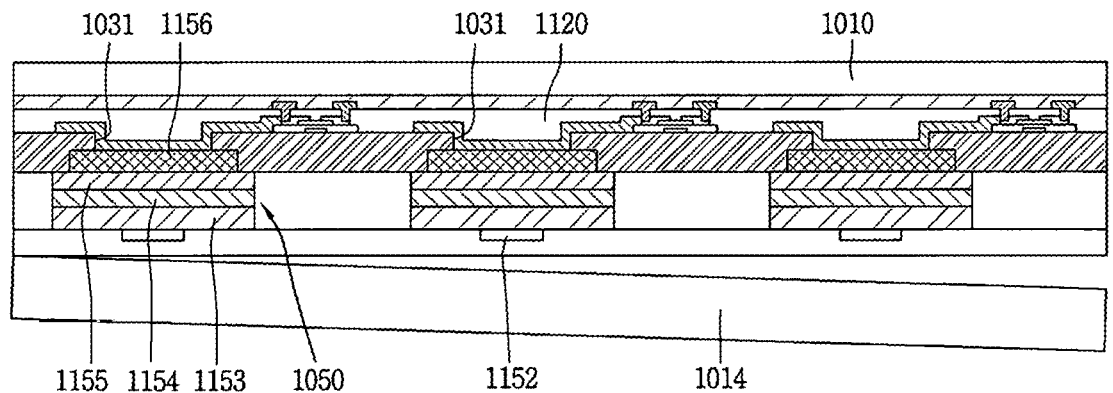

Then, a thin-film transistor is deposited, a passivation layer 1120 is formed, and a connection electrode 1032 extended from the via hole 1031 and connected to the thin-film transistor to electrically connect the deposited thin-film transistor and the via hole 1031 is formed (FIG. 13F). As described above, a lower wiring process for connecting the thin-film transistor and the via hole 1031 will be described later with reference to FIGS. 14A through 14F.

Figure 13H:
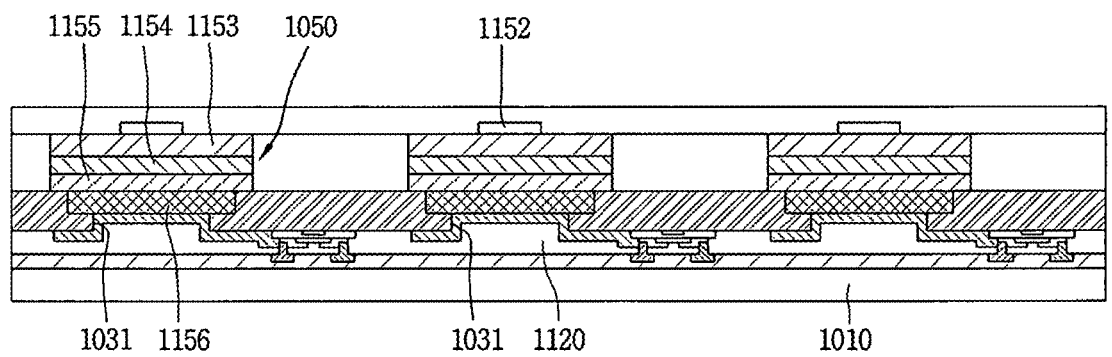

Next, the passivation layer 1120 covering the thin-film transistor is adhered to the flexible substrate 1010 (FIG. 13G), and the temporary substrate 1014 is removed (FIG. 13H). At this time, when it has a structure in which the blue semi-conductor light-emitting device, the red semi-conductor light-emitting device, and the green semi-conductor light-emitting device are sequentially arranged, a basic process of the display unit using the semi-conductor light-emitting devices is completed. However, when the semi-conductor light-emitting devices are blue semi-conductor light-emitting devices, as shown in FIGS. 10 through 12, the process of removing the cover film and forming a phosphor portion may be carried out to implement blue, red, and green.

Figure 14A:
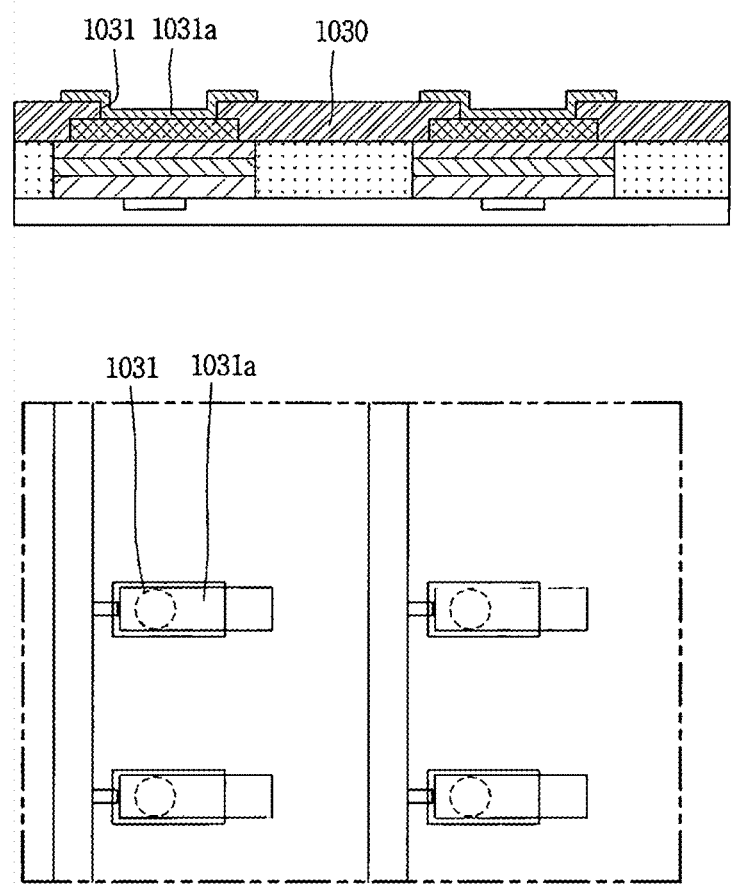
FIGS. 14A, 14B, 14C, 14D, 14E and 14F are cross-sectional views showing the process of FIG. 13F in more detail.

Describing the foregoing lower wiring process in more detail, the process of patterning the electrode 1031a on the via hole 1031 in the state of FIG. 13E is carried out (FIG. 14A). The electrode 1031a may be formed to cover at least part of the adhesive layer 1030 while filling the via hole 1031.

Figure 14B:
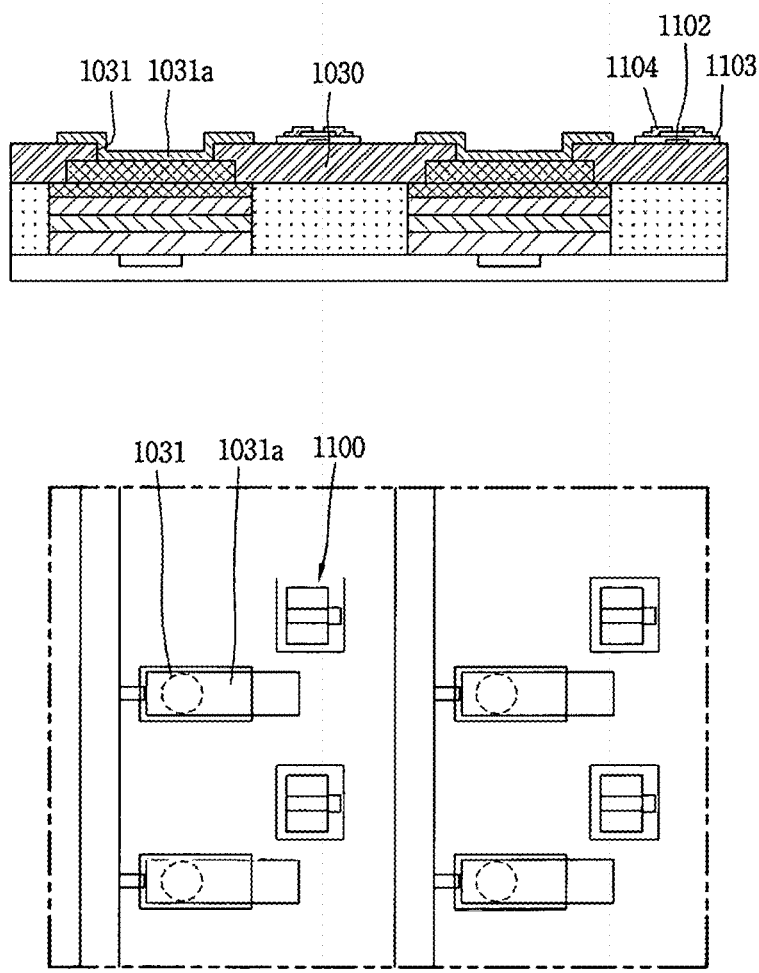

Then, the process of patterning the thin-film transistor 1100 is carried out (FIG. 14B). In this case, for the thin-film transistor, the gate electrode 1102 may be first deposited, and then the insulating layer 1103, the active layer, and the source-drain electrode 1104 may be sequentially formed. Due to this process, the source region and the drain region of the thin-film transistor 1100 may be located below the insulating film, which is farther from an upper surface of the display apparatus than the gate region. According to this structure, the thin-film transistor 1100 may be formed as an inverted structure in which a source region and a drain region are disposed on the upper side.

Figure 14C:
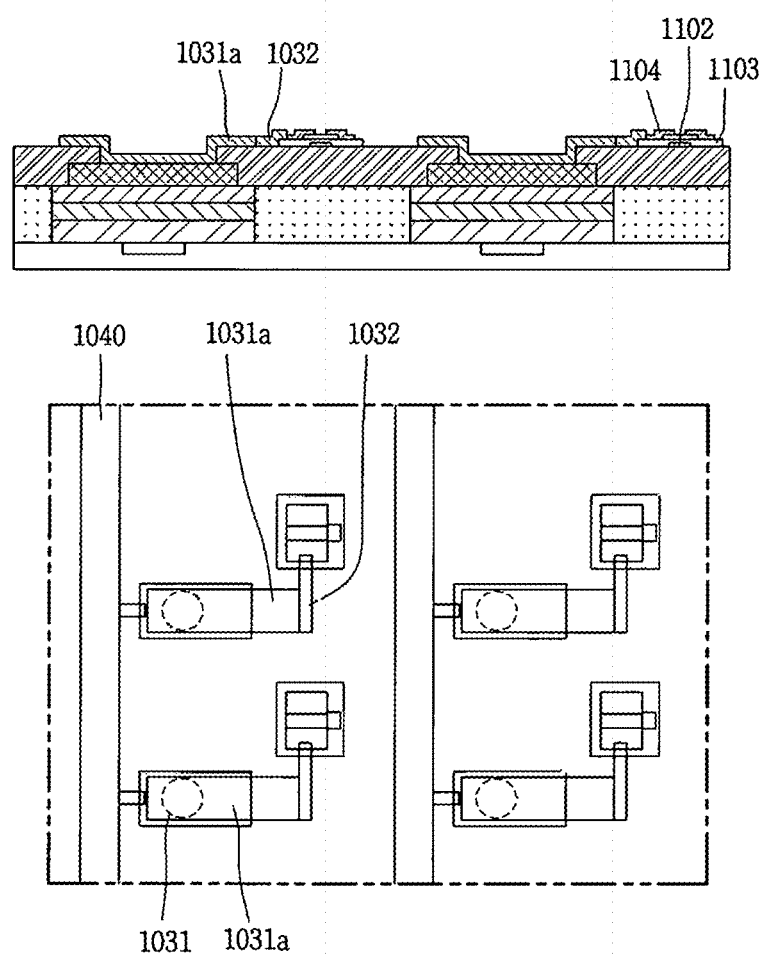

Next, the process of electrically connecting the via hole electrode 1031a to the thin-film transistor 1100 is carried out (FIG. 14C). The via hole electrode 1031a and the source-drain electrodes of the thin-film transistor may be connected to each other by the connection electrode 1032, and the connection electrode 1032 may be extended from the via hole 1031 to the thin-film transistor 1100. In this case, the connection electrode 1032 may be extended in a direction parallel to the second electrode 1040 and connected to the thin-film transistor.

Figure 14D:
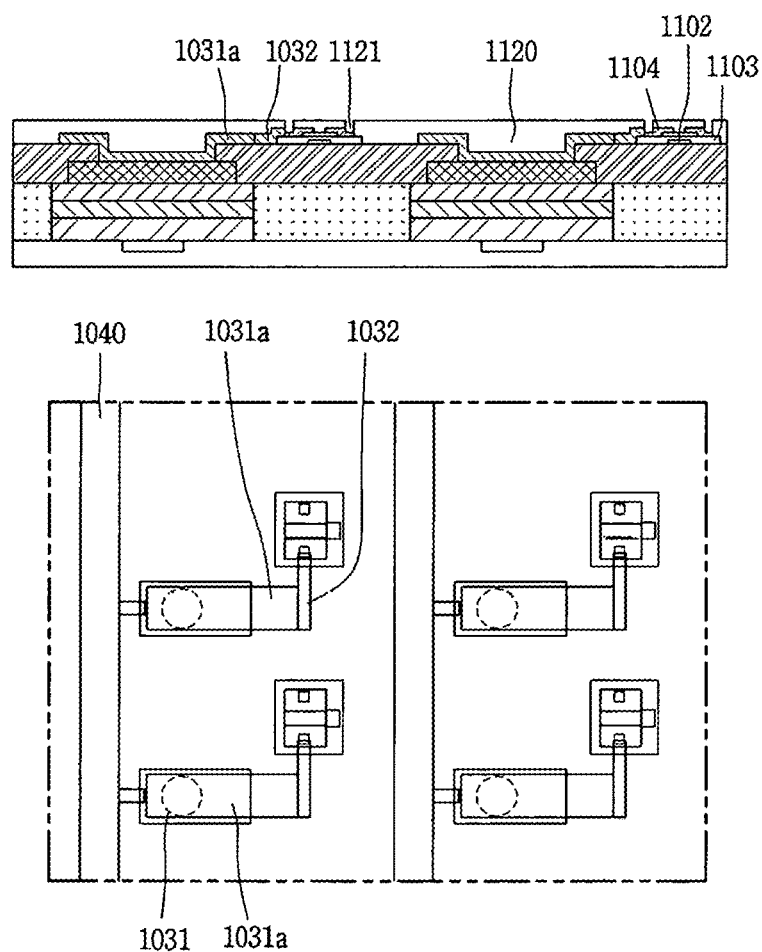
Figure 14E:
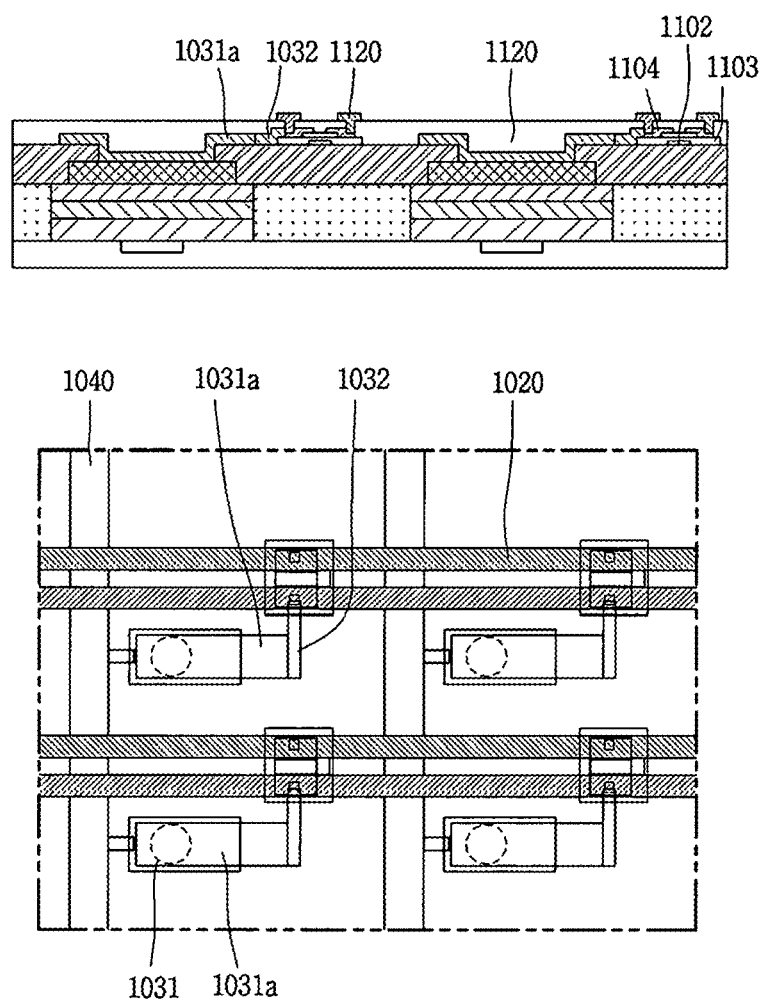

According to the illustration of FIG. 14D, a passivation layer 1120 covering the thin-film transistor 1100 is deposited, and a contact hole 1121 is formed in the passivation layer 1120 for connection to a pixel electrode. The thin-film transistor 1100 may be disposed inside the passivation layer 1120. Here, the passivation layer 1120 may be a layer covering the thin-film transistor 1100 as an interlayer insulating layer made of an insulating material, and serves to fill a gap between the individual thin-film transistors 1100.

Figure 14F:
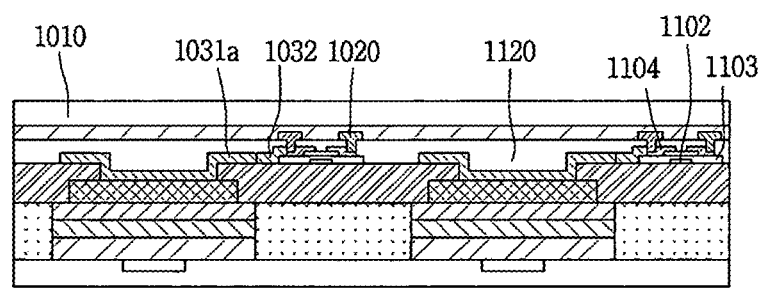
Figure 14F:
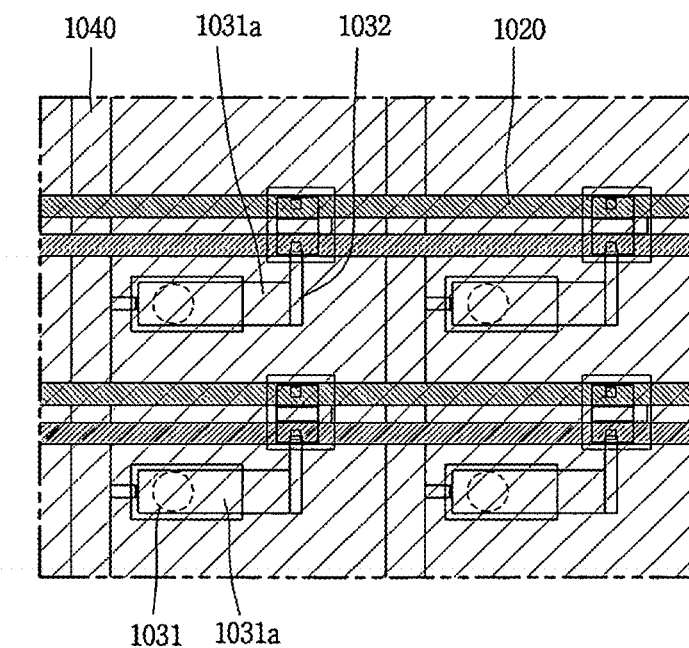

Next, a pixel electrode 1020 is formed using the contact hole 1121 (FIG. 14E), and the passivation layer 1120 is adhered to the flexible substrate 1010 (FIG. 14F). The pixel electrode as an electrode provided for each pixel is connected to a thin-film transistor (TFT) 1100 to implement an active matrix (AM) type display. According to the fabrication method described above, it allows to form a thin-film transistor subsequent to transferring the semi-conductor light-emitting device.

In the above, the configuration of the present disclosure has been described based on a vertical semi-conductor light-emitting device. The present disclosure may not be necessarily limited thereto, and a flip chip type semi-conductor light-emitting device may also be applicable thereto. Hereinafter, a display apparatus using a flip chip type semi-conductor light-emitting device will be described with reference to FIGS. 15 and 16.

Figure 15:
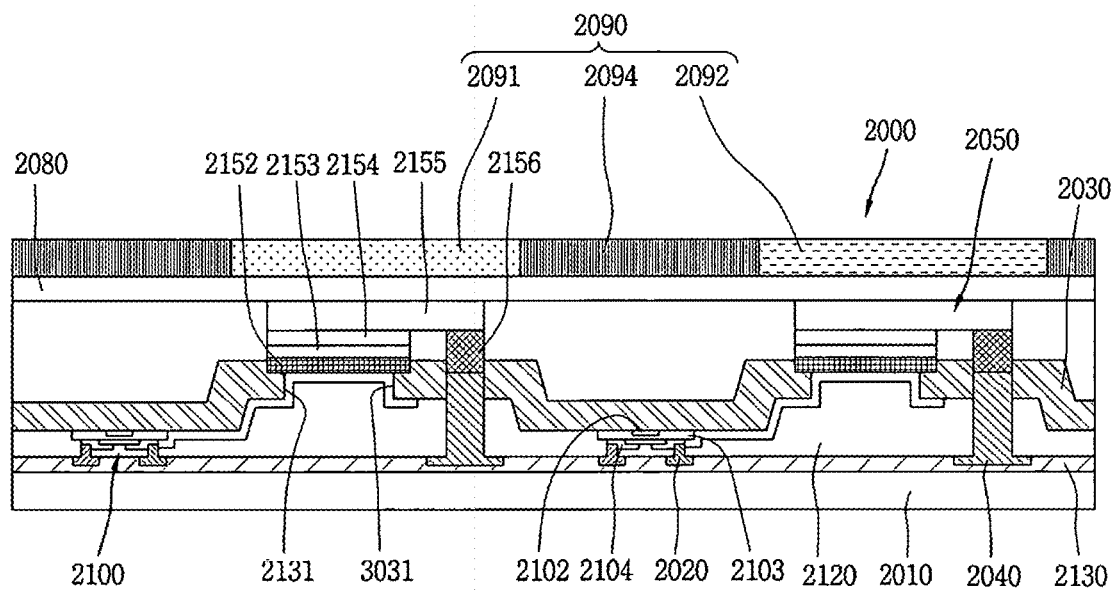
FIG. 15 is a cross-sectional view of a display apparatus using a flip-chip type semi-conductor light-emitting device.
Figure 16:
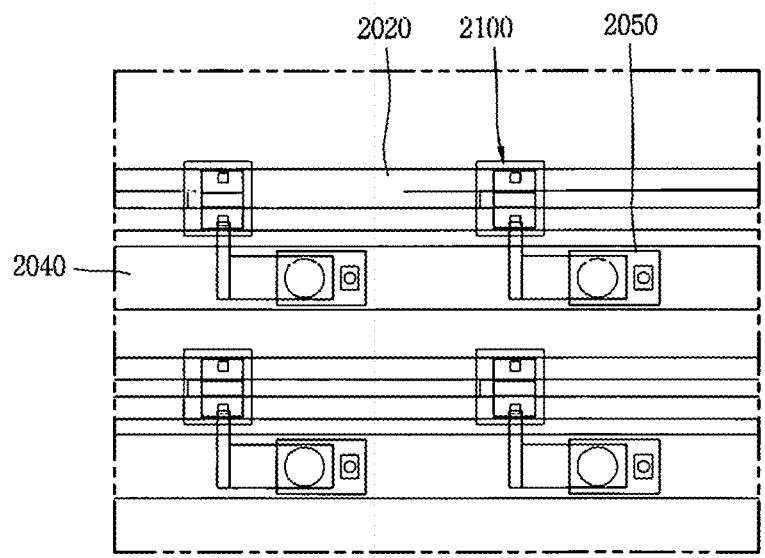
FIG. 16 is a conceptual view in which a wiring structure in FIG. 15 is seen from above.

FIG. 15 is a cross-sectional view of a display apparatus using a flip-chip type semi-conductor light-emitting device, and FIG. 16 is a conceptual view in which a wiring structure in FIG. 15 is seen from above. The display apparatus 2000 may include a substrate 2010, a first electrode 2020, an adhesive layer 2030, a second electrode 2040, and a plurality of semi-conductor light-emitting devices 2050. Here, the first electrode 2020 and the second electrode 2040 may respectively include a plurality of electrode lines.

The first electrode 2020 and the second electrode 2040 may be formed on a substrate, and the substrate 1010 as a wiring substrate may include polyimide (PI) to implement a flexible display apparatus. Therefore, the substrate may be a flexible substrate. However, the present disclosure is not necessarily limited thereto, and the substrate may be any insulating and flexible material.

The semi-conductor light-emitting device 2050 may be a flip chip type semi-conductor light-emitting device. The semi-conductor light-emitting device 2050 includes a first conductive electrode 2156, a first conductive semiconductor layer 2155 formed with the first conductive electrode 2156, an active layer 2154 formed on the first conductive semi-conductor layer 2155, a second conductive semiconductor layer 2153 formed on the active layer 2154, and a second conductive electrode 2152 formed on the second conductive semiconductor layer 2153.

Due to a flip chip type, the first conductive semiconductor layer 2155 is smaller in size than the second conductive semiconductor layer 2153, and at least part of the second conductive semiconductor layer 2153 is not covered by an active layer 2154, and the first conductive electrode 2156 and the second conductive electrode 2152 are protruded from the first conductive semiconductor layer 2155 and the second conductive semiconductor layer 2153, respectively, toward a lower portion of the display apparatus.

More specifically, the first conductive electrode 2156 and the first conductive semiconductor layer 2155 may be a p-type electrode and a p-type semiconductor layer, respectively, and the second conductive electrode 2152 and the second conductive semiconductor layer 2153 may be an n-type electrode and an n-type semiconductor layer, respectively. However, the present disclosure is not limited thereto, and the first conductive type may be n-type and the second conductive type may be p-type.

According to the drawing, the first electrode 2020 may be connected to a thin-film transistor (TFT) 2100 as a pixel electrode provided per pixel, and the thin-film transistor 2100 may be connected to the first conductive electrode 2156. In this example, the pixel electrode is connected to the thin-film transistor 2100 to implement an active matrix (AM) type display.

Meanwhile, the second electrode 2040 may be a common electrode electrically connected to the second conductive electrode 2152. Furthermore, the second electrode 2040 may be disposed below the semi-conductor light-emitting device, and formed in a direction parallel to the first electrode.

Here, a blue light emitting diode that emits blue light may be used for the semi-conductor light-emitting device 2050, and a phosphor layer 2080 capable of converting a wavelength of light emitted from the light emitting device 2050 may be located on the semi-conductor light-emitting device 2050. For example, the phosphor layer 2080 may be a yellow phosphor layer that can be mixed with blue light to convert blue light into white light.

A color filter portion 2090 may be disposed to cover the semi-conductor light-emitting device to implement three primary colors of red (R), green (G), and blue (B) using the white light converted by the phosphor layer 2080. In other words, a red (R) filter 2091, a green (G) filter 2092 and a blue (B) filter (not shown) may be provided, a pixel formed by each light emitting device may form a sub-pixel, and these three color sub-pixels may form one pixel.

Furthermore, in order to improve the contrast of the color filter portion 2090, the display apparatus may further include a black matrix 2094 disposed between each filter. The black matrix 2094 may be formed in such a manner that a gap is formed between the filters and a black material fills the gap. Through this, the black matrix 1094 may improve contrast between light and dark while absorbing external light reflection.

However, the present disclosure is not limited thereto, and the phosphor layer 2080 may include a red phosphor layer and a green phosphor layer to have a structure of converting light emitted from the blue light emitting device into red and green using the red phosphor layer and the green phosphor layer as shown in FIGS. 2, 3A and 3B.

According to the drawing, the plurality of semi-conductor light-emitting devices may be adhered to the adhesive layer 2030. For the adhesive layer 2030, a conductive material such as the above-mentioned anisotropic conductive film or the like may not be used, and for example, a material having flexibility and adhesion may be used. For such an example, the adhesive layer 2030 may have a polymer-based material having adhesiveness.

In addition, the adhesive layer 2030 may be formed in such a manner that a portion corresponding to a gap between the semi-conductor light-emitting devices is recessed from a portion to which the semi-conductor light-emitting device is adhered. In this case, the adhesive layer 2030 may be mixed with a light reflecting material to reflect light generated from the semi-conductor light-emitting device in a downward direction may be reflected in an upward direction.

According to the drawing, an insulating material may be filled between the plurality of semi-conductor light-emitting devices. Accordingly, the adhesive layer 2030 is disposed below the insulating material. Here, the insulating material is formed of a non-transparent material to prevent interference of color mixture between the semi-conductor light-emitting devices.

On the other hand, the thin-film transistor 2100 is disposed under the adhesive layer 2030. For example, a passivation layer 2120 for protecting the thin-film transistor 2100 may be formed on the other surface of the adhesive layer 2030, which is a surface opposite to one surface of the adhesive layer 2030 covered by the insulating material, and the thin-film transistor 2100 may be disposed inside the passivation layer 2120. Here, the passivation layer 2120 may be a layer covering the thin-film transistor 2100 as an interlayer insulating layer made of an insulating material, and serves to fill a gap between the individual thin-film transistors 2100.

The flexible substrate 2010 covers a lower side of the passivation layer 2120, and the flexible substrate 2010 and the passivation layer 2120 may be coupled to each other by adhesion. Accordingly, an adhesive layer 2130 may also be disposed between the flexible substrate 2010 and the passivation layer 2120.

According to the drawing, the foregoing pixel electrode of the thin-film transistor is formed to pass through the passivation layer 2120 from the thin-film transistor. For example, the thin-film transistor and the pixel electrode may be electrically connected to each other by a penetrating electrode 2130 passing through the passivation layer 2120.

The thin-film transistor may be electrically connected to the first conductive electrode 2156 of the semi-conductor light-emitting device through a via hole 2031 of the adhesive layer 2030. In this case, at least part of the first conductive electrode 2156 of the semi-conductor light-emitting device may be inserted into the adhesive layer 2030. In this case, the gate region is located closer to an upper surface of the display apparatus disposed with the display unit than the source region and the drain region, and thus the gate electrode 2102 of the gate region is disposed on the other surface of the adhesive layer 2030.

Furthermore, a via hole 2031 of the adhesive layer 2030 performs the role of electrically connecting the source and drain regions of the thin-film transistor with the first conductive electrode 2156 of the semi-conductor light-emitting device. The adhesive layer 2030 may include one side disposed with the semi-conductor light-emitting device and the other side disposed with the thin-film transistor. For example, the semi-conductor light-emitting device and the thin-film transistor are disposed on both sides of the adhesive layer 2030, and the first conductive electrode 2156 and the source-drain electrode 2104 of the thin-film transistor are electrically connected to each other through the via hole 2031. In this case, an pixel electrode of the thin-film transistor is electrically connected to the source-drain electrode 2104 and extended toward an adjacent semi-conductor light-emitting device.

Moreover, the via hole 2031 is formed to overlap with the first conductive electrode 2156 in the adhesive layer 2030, and a connection electrode 2032 extended from the via hole 2031 to electrically connect the via hole 2031 and the thin-film transistor and connected to the transistor is formed. The via hole 2031 is in direct contact with and electrically connected to the first conductive electrode 2156, and electrically connected to the source-drain electrode 2104 through the connection electrode.

According to the drawing, a second via hole 3031 may be formed in the adhesive layer 2030 for the wiring of the second conductive electrode 2152. Unlike the via hole 2031 (hereinafter, referred to as a first via hole) electrically connected to the first conductive electrode 2156, the second via hole 3031 is also configured to pass through the passivation layer 2120. Through this, the second via hole 3031 may be electrically connected to the second electrode 2040 of the flexible substrate 2010.

According to the structure described above, the adhesive layer and the wiring structure of the present disclosure may also be applicable to a display apparatus having a flip chip type semi-conductor light-emitting device. The configurations and methods according to the above-described embodiments will not be applicable in a limited way to the foregoing display apparatus using a semi-conductor light-emitting device, and all or part of each embodiment may be selectively combined and configured to make various modifications thereto.

What is claimed is:

1. A display apparatus, comprising:
    a display unit;
    a plurality of semiconductor light emitting elements having at least a first conductive electrode to form individual pixels of the display unit;
    an adhesive layer disposed between adjacent semiconductor light emitting elements;
    a thin-film transistor having a gate region disposed closer to an upper surface of the display unit than a source region and a drain region;
    a via hole formed in the adhesive layer;
    a via hole electrode extending in the via hole and electrically connecting the at least one conductive electrode of a corresponding semiconductor light emitting element and a source-drain electrode of the thin-film transistor; and
    a connection electrode connecting the via hole electrode to the first conductive electrode,
    wherein the via hole electrode extends in the via hole and to a lower surface of the adhesive layer, and
    wherein the connection electrode is disposed on the lower surface of the adhesive layer and is not disposed within the via hole.

2. The display apparatus of claim 1, wherein the via hole formed in the adhesive layer overlaps the first conductive electrode.

3. The display apparatus of claim 1, wherein the thin-film transistor comprises an insulating layer on the adhesive layer, and the gate region on a first side of the insulating layer, and the source region and the drain region on a second side of the insulating layer.

4. The display apparatus of claim 3, wherein the gate region comprises a gate electrode.

5. The display apparatus of claim 3, wherein the source region and the drain region are located below the insulating layer.

6. The display apparatus of claim 1, further comprising:
    a passivation layer protecting the thin-film transistor formed on the adhesive layer.

7. The display apparatus of claim 6, wherein a pixel electrode of the thin-film transistor passes through the passivation layer from the thin-film transistor.

8. The display apparatus of claim 6, further comprising:
    a flexible substrate covering a lower side of the passivation layer.

9. The display apparatus of claim 1, wherein the first conductive electrode of the corresponding semiconductor light-emitting elements is electrically connected to the thin-film transistor, and a second conductive electrode of the corresponding semiconductor light-emitting elements is electrically connected to a common electrode.

10. The display apparatus of claim 9, wherein at least part of the first conductive electrode is inserted into the adhesive layer.

11. The display apparatus of claim 1, further comprising:
    a gap insulating layer formed between the semiconductor light emitting elements.

12. The display apparatus of claim 11, wherein the adhesive layer is formed on the gap insulating layer.

13. The display apparatus of claim 1, wherein the semiconductor light emitting elements comprise vertical type semi-conductor light-emitting devices.

14. The display apparatus of claim 1, wherein the connection electrode comprises a step portion stepped from the lower surface of the adhesive layer to an insulating layer of the thin-film transistor on the adhesive layer.

15. The display apparatus of claim 1, wherein the connection electrode extends in a direction parallel to the source-drain electrode of the thin-film transistor.

16. The display apparatus of claim 1, wherein the via hole electrode covers at least part of the adhesive layer while filling the via hole.

* * * * *